(12) United States Patent
Park et al.

(10) Patent No.: US 10,509,145 B2
(45) Date of Patent: Dec. 17, 2019

(54) OPTICAL DEVICE AND METHODS FOR MANUFACTURING THE SAME

(71) Applicant: Electronics and Telecommunications Research Institute, Daejeon (KR)

(72) Inventors: Young Sam Park, Daejeon (KR); Doo-Hee Cho, Daejeon (KR); Jeong Ik Lee, Daejeon (KR); Jonghee Lee, Daejeon (KR); Seongdeok Ahn, Daejeon (KR); Byoung Gon Yu, Chungcheongbuk-do (KR); Nam Sung Cho, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 36 days.

(21) Appl. No.: 15/294,078

(22) Filed: Oct. 14, 2016

(65) Prior Publication Data

US 2017/0108621 A1 Apr. 20, 2017

(30) Foreign Application Priority Data

Oct. 15, 2015 (KR) .................. 10-2015-0144132
Nov. 3, 2015 (KR) .................. 10-2015-0154058
(Continued)

(51) Int. Cl.
*G02B 1/02* (2006.01)
*B05D 1/00* (2006.01)
(Continued)

(52) U.S. Cl.
CPC .............. *G02B 1/02* (2013.01); *B05D 1/60* (2013.01); *C30B 23/00* (2013.01); *C30B 29/54* (2013.01)

(58) Field of Classification Search
CPC .. G02B 3/0012; G02B 1/02; C30B 29/54–58; B05D 1/60
See application file for complete search history.

(56) References Cited

U.S. PATENT DOCUMENTS 5,393,564 A * 2/1995 Westmoreland .... C23C 16/4485
427/248.1
5,581,379 A * 12/1996 Aoyama .............. G02B 3/0018
349/5
(Continued)

FOREIGN PATENT DOCUMENTS

CN 101063779 A 10/2007
CN 100480739 C 4/2009
(Continued)

OTHER PUBLICATIONS

Choi et al. A liquid crystalline polymer microlens array with tunable focal intensity by the polarization control of a liquid crystal layer Appl. Phys. Lett. 91, 221113 (2007).*
(Continued)

*Primary Examiner* — Alex A Rolland
(74) *Attorney, Agent, or Firm* — Rabin & Berdo, P.C.

(57) ABSTRACT

Provided are an optical device and a manufacturing method thereof. The method of manufacturing an optical device may include providing a substrate structure, and depositing an array including curved structures on the substrate structure. The curved structures may include a crystalline organic compound.

11 Claims, 17 Drawing Sheets

(30) Foreign Application Priority Data

Jun. 7, 2016 (KR) ........................ 10-2016-0070540
Sep. 7, 2016 (KR) ........................ 10-2016-0115191
Oct. 4, 2016 (KR) ........................ 10-2016-0127850

(51) Int. Cl.
*C30B 23/00* (2006.01)
*C30B 29/54* (2006.01)

(56) References Cited

U.S. PATENT DOCUMENTS

| | | | |
|---|---|---|---|
| 5,790,218 A * | 8/1998 | Koden | G02F 1/141 349/92 |
| 5,926,319 A * | 7/1999 | Phillips | G02B 3/0031 359/619 |
| 7,528,911 B2 | 5/2009 | Kudo | |
| 7,532,405 B2 | 5/2009 | Mino et al. | |
| 7,585,769 B2 | 9/2009 | Bour et al. | |
| 7,834,528 B2 | 11/2010 | Numajiri et al. | |
| 8,569,615 B2 | 10/2013 | Jung et al. | |
| 8,826,760 B2 | 9/2014 | Feldt et al. | |
| 9,140,940 B2 | 9/2015 | Wang et al. | |
| 2003/0054586 A1 * | 3/2003 | Shtein | C23C 14/12 438/99 |
| 2014/0168578 A1 * | 6/2014 | Wang | G02F 1/1334 349/96 |

FOREIGN PATENT DOCUMENTS

| | | |
|---|---|---|
| CN | 102736304 A | 10/2012 |
| CN | 103904228 A | 7/2014 |
| KR | 10-0473806 B1 | 3/2005 |
| KR | 10-0606325 B1 | 7/2006 |
| KR | 10-0998059 B1 | 12/2010 |
| WO | 2010113737 A1 | 10/2010 |

OTHER PUBLICATIONS

Jung-Bum Kim et al., "Highly enhanced light extraction from organic light emitting diodes with little image blurring and good color stability", Organic Electronics, vol. 17, pp. 115-120, 2015.

Yong-Seok Park et al., "Atmospheric Plasma Treatment of Flexible IZO Electrode Grown on PET Substrate for Flexible Organic Solar Cells", Electrochemical and Solid-State Letters, vol. 12, Issue 12, pp. H426-H429, Sep. 24, 2009.

* cited by examiner

OPTICAL DEVICE AND METHODS FOR MANUFACTURING THE SAME

CROSS-REFERENCE TO RELATED APPLICATIONS

This U.S. non-provisional patent application claims priority under 35 U.S.C. § 119 of Korean Patent Application Nos. 10-2015-0144132, filed on Oct. 15, 2015, 10-2015-0154058, filed on Nov. 3, 2015, 10-2016-0070540, filed on Jun. 7, 2016, 10-2016-0115191, filed on Sep. 7, 2016, and 10-2016-0127850, filed on Oct. 4, 2016, the entire contents of which are hereby incorporated by reference.

BACKGROUND OF THE INVENTION

The present disclosure herein relates to optical devices, and more particularly, to curved structures, arrays including the same, and optical devices including the curved structures and arrays.

An optical device may include an optoelectronic device, in which electromagnetic radiation is generated by electricity or electricity is generated by electromagnetic radiation. The optical device may include optically functional films such as a light refraction film, a light scattering film, an anti-glare film, and a haze film. Examples of the optical device may include an organic light-emitting diode, a solar cell, and a photo-detector.

An organic light-emitting device is a self-emissive device that emits light by electrically exciting an organic light-emitting material. The organic light-emitting device includes a substrate, a cathode, an anode, and an organic light-emitting layer. The organic light-emitting layer may be disposed between the cathode and the anode. When a voltage is applied to the organic light-emitting device, electrons injected from the cathode and holes injected from the anode are combined in the organic light-emitting layer to form molecular excitons. The molecular excitons emit light by releasing energy when returning to a ground state.

The solar cell is a device that generates electricity from external light. Due to a photoelectric effect, incident light produces electrons and holes in a light-absorbing layer. The electrons and holes move to electrodes (anode and cathode) to produce electricity. Light passing through the light-absorbing layer may be reabsorbed in the light-absorbing layer by being scattered/reflected by a light scattering film. The photo-detector is a device that converts external light to an electrical signal. The photo-detector is a device that detects and converts intensity of an incident light signal to an electrical signal.

The light refraction film may introduce more light into a desired position by refracting light having a specific wavelength.

The light scattering film may scatter transmitted light.

The anti-glare film may suppress glare by controlling reflection and refraction of light having a specific wavelength.

Since the haze film may scatter light having a specific wavelength, transmittance of the haze film for the light having a specific wavelength may be reduced.

SUMMARY OF THE INVENTION

The present disclosure provides an optical device with improved optical performance and a manufacturing method thereof.

The present disclosure also provides a method of simply manufacturing an optical device.

Provided are an optical device with improved optical performance and a manufacturing method thereof. An optical device according to an embodiment of the inventive concept may include a substrate structure; and an array which is disposed on the substrate structure and includes curved structures, wherein the curved structures may include a crystalline organic compound.

In an embodiment, the crystalline organic compound may have a pi-conjugation structure.

In an embodiment, the curved structures may include benzene, naphtalene, phenanthrene, biphenyl, quinoline, fluorine, phenylpyrazole, phenanthroline, quinodimethane, quinoxaline, indolocarbazole, carbazole, spirobifluorene, pyridine, thiophene, dibenzothiophene, furan, diazafluoren, benzofuropyridine, triazine, antracene, pyrene, benzothiazolel, coumarine, quinacridone, phenylpyridine, oxadiazole, phenoxazine, or derivatives thereof.

In an embodiment, the curved structures may include at least one of N,N'-Di(1-naphthyl)-N,N'-diphenyl-(1,1'-biphenyl)-4,4'-diamine, Tris-(8-hydroxyquinoline)aluminum, and derivatives thereof.

In an embodiment, surface tension of each of the curved structures may be higher than surface tension of a top surface of the substrate structure.

In an embodiment, each of the curved structures may include a first grain and a second grain, and the second grain may have a different crystal structure or a different crystal orientation from the first grain.

In an embodiment of the inventive concept, a method of manufacturing an optical device includes preparing a substrate structure; and depositing an array including curved structures on the substrate structure, wherein the curved structures may include a crystalline organic compound.

In an embodiment, the depositing of the array may include: heating a precursor to form an organic vapor; and depositing the organic vapor on the substrate structure.

In an embodiment, the precursor may include an amorphous organic compound.

In an embodiment, the heating of the precursor may be performed in a temperature range of from 200° C. to 400° C.

In an embodiment, the formation of the organic vapor may be performed under a pressure condition of from $10^{-4}$ Torr to 1 Torr.

In an embodiment, the substrate structure may be provided at a temperature of from −20° C. to 80° C. during the deposition of the array.

In an embodiment, the depositing of the array may be performed by organic vapor phase deposition or thermal evaporation.

In an embodiment, the crystalline organic compound may have a pi-conjugation structure.

In an embodiment, each of the curved structures may include a first grain and a second grain, and the second grain may have a different crystal structure or a different crystal orientation from the first grain.

In an embodiment, surface tension of each of the curved structures may be higher than surface tension of a top surface of the substrate structure.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, the manufacture of an optical device according to the inventive concept will be described.

Figure 1A:
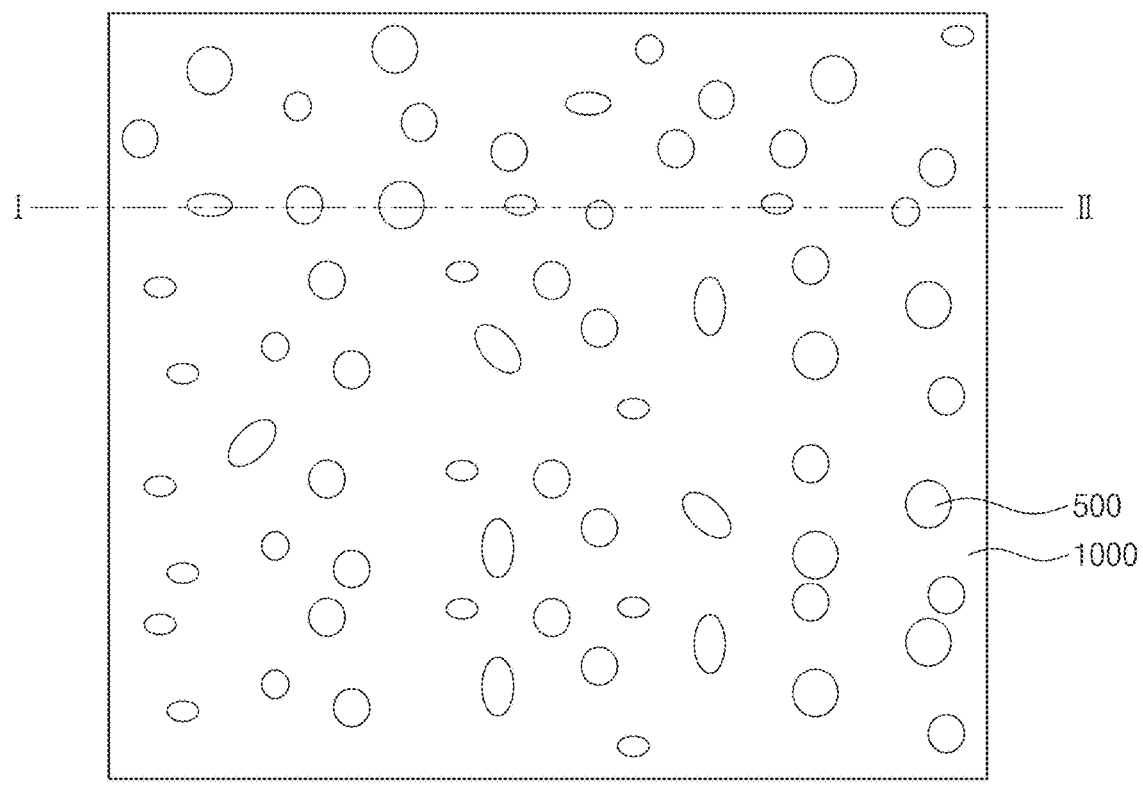
FIG. 1A is a plan view illustrating an optical device according to an embodiment.
Figure 1B:
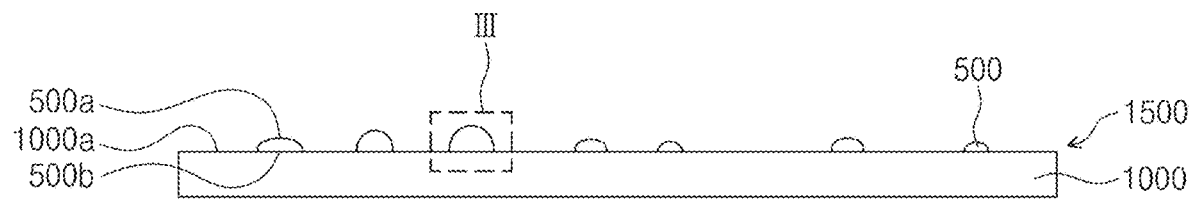
FIG. 1B is a cross-sectional view taken along line I-II of FIG. 1A.
Figure 1C:
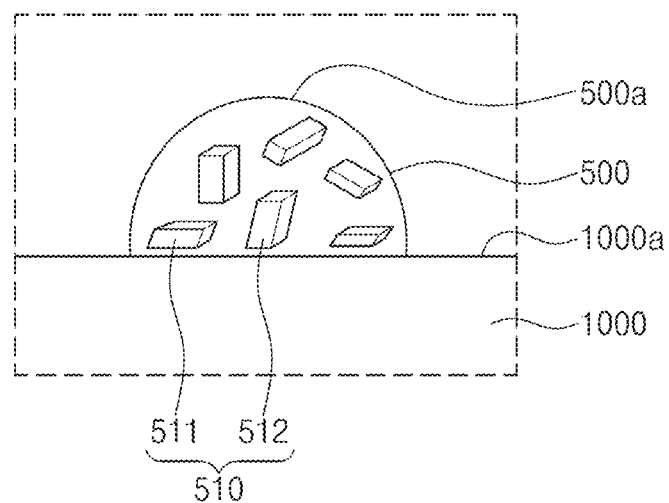
FIG. 1C is an enlarged view of region III of FIG. 1B.

FIG. 1A is a plan view illustrating an optical device according to an embodiment. FIG. 1B is a cross-sectional view illustrating the optical device according to the embodiment, which corresponds to a cross section taken along line I-II of FIG. 1A. FIG. 1C is an enlarged view of region III of FIG. 1B.

Referring to FIGS. 1A and 1B, an array 1500 may be provided on a substrate structure 1000. The substrate structure 1000 may include a single layer or a multilayer. The substrate structure 1000 may have a top surface 1000a and a bottom surface which are opposite to each other. The array 1500 may include curved structures 500. The curved structures 500 may be disposed to be spaced apart from each other. Hereinafter, the single curved structure 500 will be described. The curved structure 500 may have a bottom surface 500b and a top surface 500a. The curved structure 500 may denote a structure in which at least one surface thereof is a curved surface. For example, at least a portion of the top surface 500a of the curved structure 500 may be a curved surface. As another example, at least a portion of a side surface of the curved structure 500 may be a curved surface. The curved structure 500 may have a shape of a sphere or a hemisphere. The curved structure 500 may have a diameter of about 200 nm to about 700 nm.

As in Equation 1, a sum of surface tension (γ1) of the curved structure 500 and surface tension (γ2) at an interface between the top surface of the substrate structure 1000 and the curved structure 500 may be greater than surface tension (γ3) of the top surface of the substrate structure 1000.

$$\gamma1+\gamma2>\gamma3 \qquad \text{[Equation 1]}$$

Herein, surface tension (γ2) at an interface between the substrate structure 1000 and the curved structure 500 may denote the surface tension at the interface between the top surface of the substrate structure 1000 and the curved structure 500. When Equation 1 is satisfied between the substrate structure 1000 and some component, the curved structure 500 may be formed. As in Equation 2, when a sum of surface tension (γ1') of some component and the surface tension (γ2') at the interface between the substrate structure 1000 and the some component is less than or equal to the surface tension (γ3) of the substrate structure 1000, the curved structure 500 may not be formed. For example, a deposited layer may have a flat top surface and the array may not be formed.

$$\gamma1'+\gamma2'\leq\gamma3 \qquad \text{[Equation 2]}$$

According to an embodiment, the surface tension (γ2) at the interface between the substrate structure 1000 and the curved structure 500 of Equation 1 and the surface tension (γ2') at the interface between the substrate structure 1000 and some component of Equation 2 are very small and thus, these surface tensions may be omitted.

The curved structure 500 may include an organic compound. The curved structure 500 may include an organic material and an organic metal compound. The curved structure 500 may include carbon (C), hydrogen (H), oxygen (O), sulfur (S), nitrogen (N), fluorine (F), iodine (I), chlorine (Cl), bromine (Br), and/or phosphorus (P). The organic compound may have a pi-conjugation structure. For example, the curved structure 500 may include at least one aromatic ring compound. As another example, the curved structure 500 may include a hetero ring compound, and the hetero ring compound may include a metal element such as platinum (Pt), iridium (Ir), osmium (Os), aluminum (Al), titanium (Ti), copper (Cu), lithium (Li), zinc (Zn), beryllium (Be), boron (B), ruthenium (Ru), and/or sodium (Na). As another example, the organic compound may include a metal complex including a ligand and a metal. In this case, the ligand may include an aromatic ring compound, and the metal may include Pt, Ir, Os, Al, Ti, Cu, Li, Zn, Be, B, Ru, and/or Na. For example, the curved structure 500 may include N,N'-Di(1-naphthyl)-N,N'-diphenyl-(1,1'-biphenyl)-4,4'-diamine (hereinafter, referred to as NPB) or a derivative thereof, and/or Tris-(8-hydroxyquinoline)aluminum (Alq3) or a derivative thereof. The curved structure 500 may have a weight-average molecular weight (Mw) of about 100 to about 2,000. For example, the curved structure 500 may include benzene, naphtalene, phenanthrene, biphyenyl, quinoline, fluorine, phenylpyrazole, phenanthroline, quinodimethane, quinoxaline, indolocarbazole, carbazole, spirobifluorene, pyridine, thiophene, dibenzothiophene, furan, diazafluoren, benzofuropyridine, triazine, antracene, pyrene, benzothiazolel, coumarine, quinacridone, phenylpyridine, oxadiazole, phenoxazine, and/or derivatives thereof.

Referring to FIG. 1C, the curved structure 500 may include a crystalline structure. Herein, the expression "crystalline" may denote a state in which an organic compound is regularly stacked. The curved structure 500 may have a single crystal or polycrystalline structure. The curved structure 500 may include a plurality of grains 510. The grains 510 may include a first grain 511 and a second grain 512. The second grain 512 may have a different crystal structure or crystal orientation from the first grain 511. For example, each of the first grain 511 and the second grain 512 may have a monoclinic system. A β-crystal axis of the first grain 511 may be different from a β-crystal axis of the second grain 512. Herein, the β-crystal axis may denote an angle between a <100> axis and a <001> axis. A crystalline organic compound may have higher surface tension than an amorphous organic compound. For example, crystalline polyethylene may have a surface tension of about 66.8 dyne/cm and amorphous polyethylene may have a surface tension of about 35.7 dyne/cm. When a deposited layer is amorphous, the deposited layer may have low surface tension. Since Equation 2 is satisfied between the deposited layer and the substrate structure 1000, the deposited layer may not have a curved surface. According to embodiments, since the crystalline organic compound is deposited, Equation 1 may be satisfied between the deposited layer and the substrate structure 1000. Accordingly, the curved structure 500 may be formed.

The deposition of the curved structure 500 may be performed by organic vapor phase deposition (OVPD) or thermal evaporation. Hereinafter, referring to FIG. 2, the formation of the curved structure 500 by the OVDP will be described in more detail.

Figure 2:
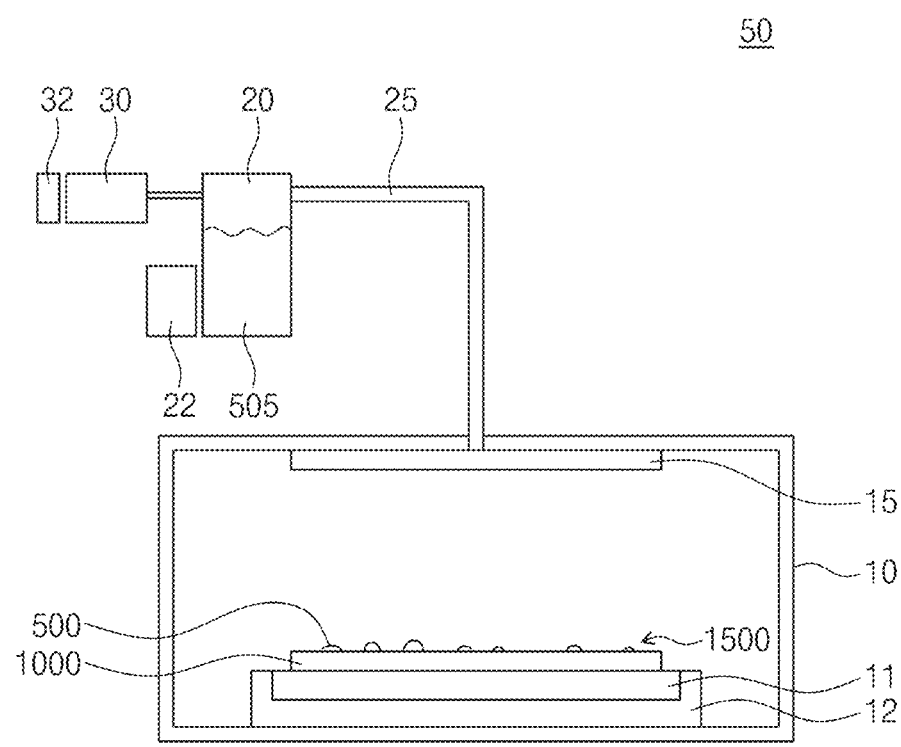
FIG. 2 is a schematic diagram illustrating a deposition apparatus for explaining a method of manufacturing a curved structure according to an embodiment.

FIG. 2 is a schematic diagram illustrating a deposition apparatus for explaining a method of manufacturing a curved structure according to an embodiment.

Referring to FIG. 2 together with FIG. 1B, a deposition apparatus 50 may include a deposition chamber 10, a shower head 15, a source chamber 20, and a carrier chamber 30. The deposition chamber 10 may provide a closed space from the outside. The source chamber 20 may be connected to the deposition chamber 10 through a gas passage 25. A first temperature controller 22 may be provided on the source chamber 20. Although it has been illustrated that the first temperature controller 22 is disposed adjacent to the source chamber 20, the disposition of the first temperature controller 22 is not limited thereto. For example, the first temperature controller 22 may be a coil surrounding the source chamber 20. The first temperature controller 22 may heat the source chamber 20. The carrier chamber 30 may be disposed adjacent to the source chamber 20 and may be connected to the source chamber 20. A second temperature controller 32 may be provided on the carrier chamber 30. The second temperature controller 32 may heat the carrier chamber 30.

The substrate structure 1000 may be loaded in the deposition chamber 10 of the deposition apparatus 50. For example, the substrate structure 1000 may be disposed on a chuck 11 in the deposition chamber 10. The plurality of curved structures 500 may be deposited on the substrate structure 1000 to form the array 1500. For example, a precursor (see 505 in FIG. 2) may be provided to the source chamber 20. In this case, the precursor may include an amorphous organic compound. As another example, the precursor may include a crystalline organic compound. The precursor may further include a material other than the organic compound, but, alternatively, the precursor may not include the material other than the organic compound. The organic compound included in the precursor may be provided in the form of powder, but the embodiment of the inventive concept is not limited thereto. The source chamber 20 may be heated to a temperature of about 200° C. to about 400° C. to form an organic vapor from the precursor 505. The organic vapor may include the amorphous organic compound, but the embodiment of the inventive concept is not limited thereto.

The organic vapor may be deposited as a crystalline layer on the top surface 1000a of the substrate structure 1000. Equation 1 may be satisfied between the substrate structure 1000 and the deposited crystalline organic compound. Accordingly, the curved structures 500 may be formed.

The heating of the organic compound may be performed in a temperature range of about 200° C. to about 400° C. That is, during the formation of the curved structures 500, the temperature of the source chamber 20 may be maintained at about 200° C. to about 400° C. When the temperature of the source chamber 20 is less than about 200° C., the organic vapor may not be formed or the layer deposited on the substrate structure 1000 may be amorphous or may not have a curved surface. When the temperature is greater than about 400° C., the organic compound in the source chamber 20 may be modified.

The formation of the organic vapor may be performed under a pressure condition of about $10^{-4}$ Torr to about 1 Torr. For example, during the formation of the curved structures 500, the pressure in the source chamber may be in a range of about $10^{-4}$ Torr to about 1 Torr. When the pressure is less than about $10^{-4}$ Torr, the deposited layer may include an amorphous phase and may be flat. When the pressure is greater than about 1 Torr, the deposited layer may not have a sufficient curved surface and may be flat.

During the formation of the curved structures 500, a temperature of the substrate structure 1000 may be maintained at about −20° C. to about 80° C. The temperature of the substrate structure 1000 may be controlled by a third temperature controller 12. The chuck 11 may be disposed on the third temperature controller 12 and may heat or cool the substrate structure 1000. When the temperature of the substrate structure 1000 is less than about −20° C., the deposited layer may be amorphous. When the temperature of the substrate structure 1000 is greater than about 80° C., the deposited layer may not have a sufficient curved surface and may be flat.

A deposition rate of the curved structure 500 may be controlled to be in a range of about 1 nm/min to about 100 nm/min. When the deposition rate of the curved structure 500 is less than about 1 nm/min, excessively small curved structures 500 may be formed. When the deposition rate is greater than about 100 nm/min, the deposited layer may be amorphous and flat.

According to embodiments, the deposition apparatus 50 is not limited to that illustrated in FIG. 2, but various deposition apparatuses may be used. The curved structures 500 may be formed by various deposition methods, for example, thermal evaporation.

Hereinafter, the manufacture of curved structures according to experimental examples of the inventive concept and the evaluation results thereof will be described.

COMPARATIVE EXAMPLE 1

A glass substrate having a length of about 2.5 cm and a width of about 2.5 cm was prepared. A substrate structure was prepared by depositing an indium zinc oxide layer on the glass substrate to a thickness of about 60 nm using a sputter. The substrate structure included the indium zinc oxide layer on the glass substrate.

COMPARATIVE EXAMPLE 2

A glass substrate having a length of about 2.5 cm and a width of about 2.5 cm was prepared. A substrate structure was prepared by depositing an indium zinc oxide layer on the glass substrate to a thickness of about 60 nm using a sputter.

A thermal evaporation process was performed on the indium zinc oxide layer using N,N'-Di(1-naphthyl)-N,N'-diphenyl-(1,1'-biphenyl)-4,4'-diamine (hereinafter, referred to as NPB). In this case, a heating temperature of the NPB was about 180° C. A pressure during the heating of the NPB was about $10^{-5}$ Torr. A deposited layer had a thickness of about 60 nm.

EXPERIMENTAL EXAMPLE 1

A glass substrate having a length of about 2.5 cm and a width of about 2.5 cm was prepared. A substrate structure was prepared by depositing an indium zinc oxide layer on the glass substrate to a thickness of about 60 nm using a sputter.

An organic vapor phase deposition process was performed on the indium zinc oxide layer using NPB. During the organic vapor phase deposition process, a heating temperature of the NPB in a source chamber was controlled to be about 340° C., and a pressure of the source chamber was controlled to be about 0.1 Torr.

Figure 3A:
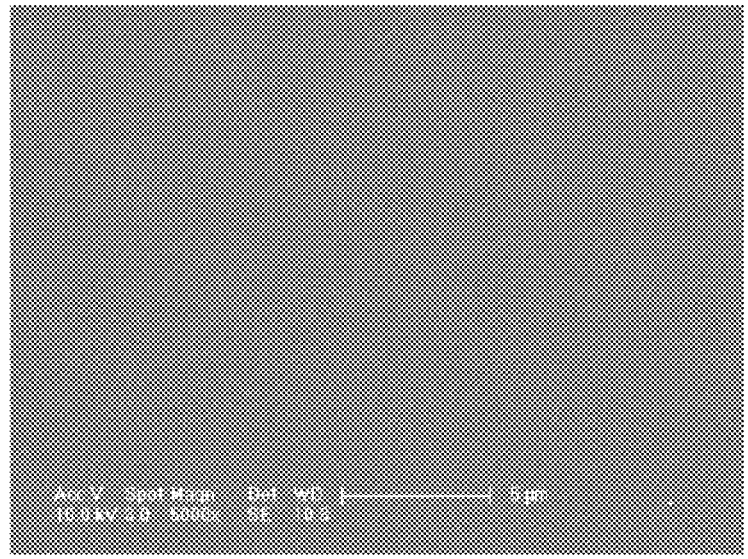
FIGS. 3A and 3B are scanning electron microscope images of planes of Comparative Examples 1 and 2 tilted at 45 degrees, respectively.
Figure 3B:
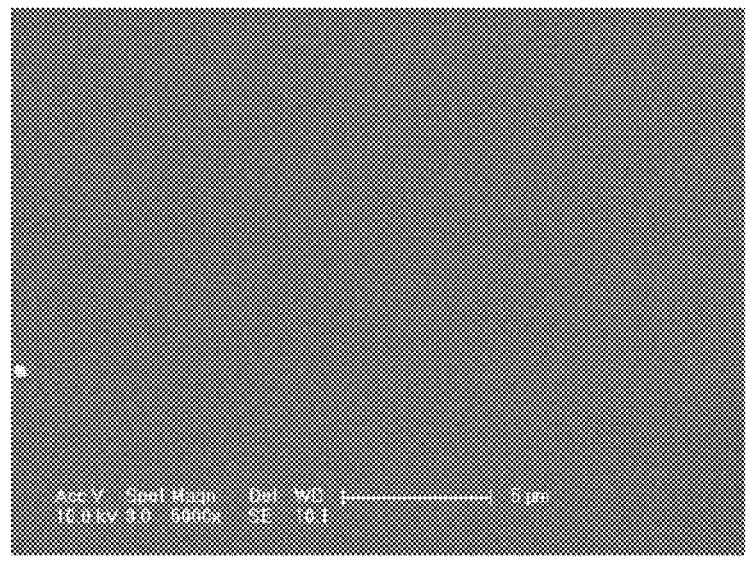
Figure 3C:
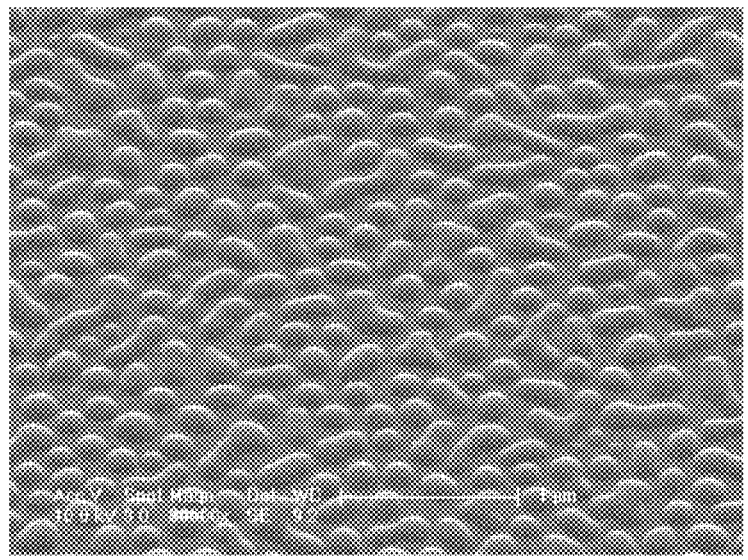
FIG. 3C is a scanning electron microscope image of a plane of Experimental Example 1 tilted at 45 degrees.
Figure 3D:
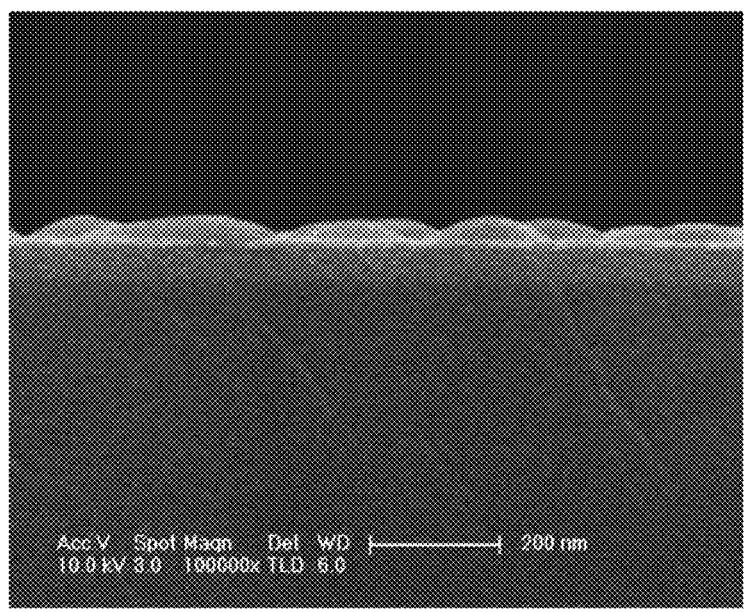
FIG. 3D is a scanning electron microscope image of a cross section of Experimental Example 1.

FIGS. 3A and 3B are scanning electron microscope images of planes of Comparative Examples 1 and 2 tilted at 45 degrees, respectively. FIG. 3C is a scanning electron microscope image of a plane of Experimental Example 1 tilted at 45 degrees. FIG. 3D is a scanning electron microscope image of a cross section of Experimental Example 1.

Referring to FIG. 3A, it may be observed that a top surface of the indium zinc oxide layer of Comparative Example 1 was flat.

Referring to FIG. 3B, it may be observed that a top surface of the deposited layer of Comparative Example 2 was flat.

Referring to FIGS. 3C and 3D together with FIG. 1B, it may be observed that the array 1500 was disposed on the substrate structure 1000. The array 1500 may include the curved structures 500 that are spaced apart from one another. As in FIG. 3D, it may be observed that top surfaces of the curved structures 500 were curved surfaces. Diameters of the curved structures 500 were measured in a range of about 200 nm to about 700 nm. It was observed that a plane area of the array 1500 was about 70% of a plane area of the substrate structure 1000.

Figure 4A:
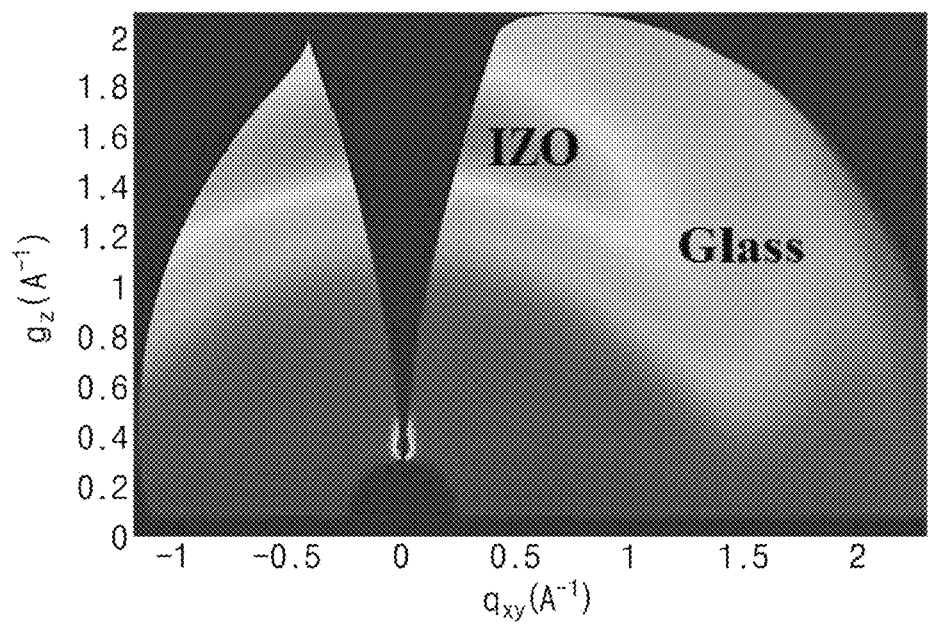
FIGS. 4A through 4C illustrate results of grazing-incidence small-angle X-ray scattering (GISAXS) analysis of Comparative Examples 1 and 2 and Experimental Example 1, respectively.
Figure 4B:
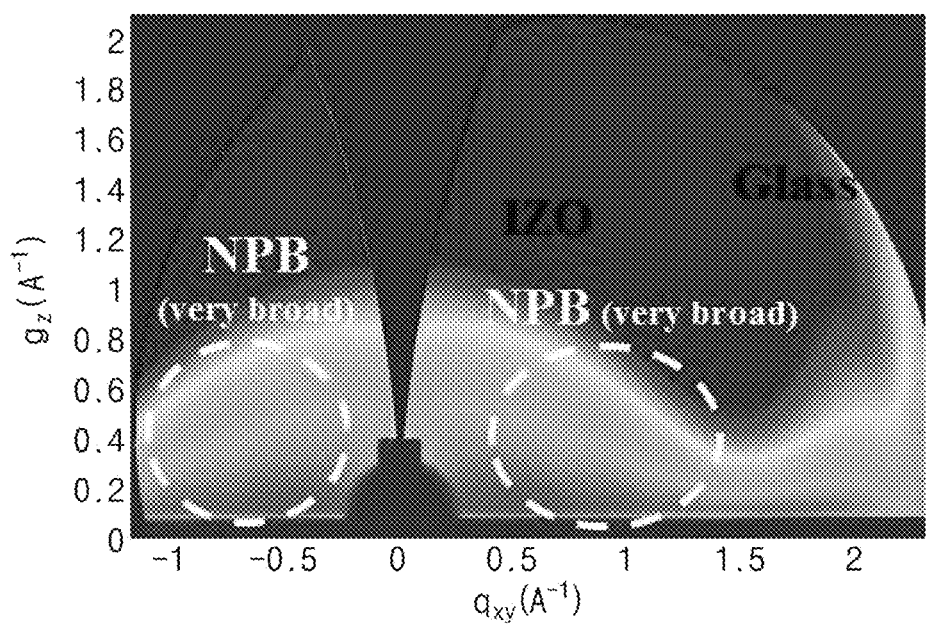
Figure 4C:
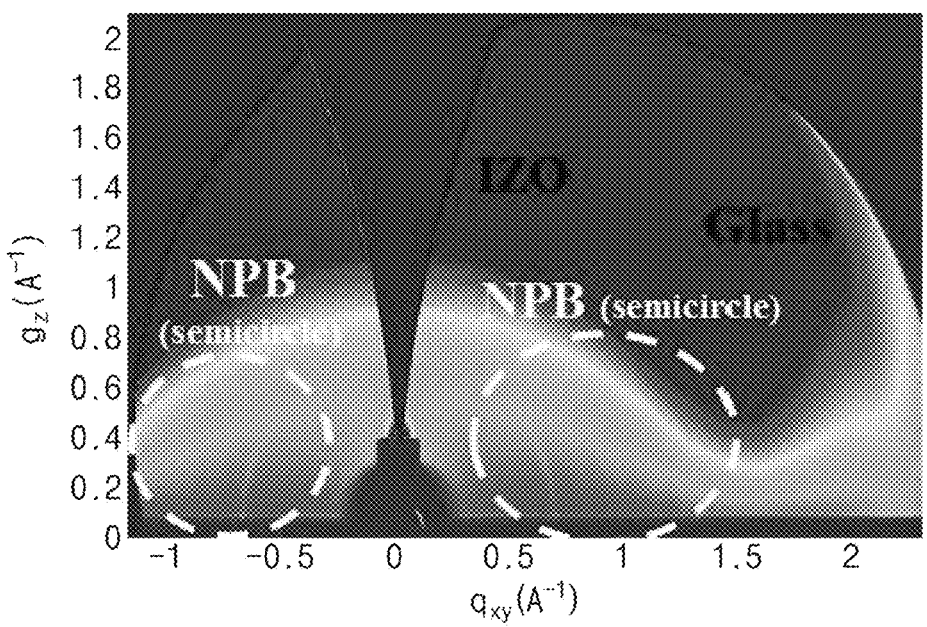

FIGS. 4A through 4C illustrate results of grazing-incidence small-angle X-ray scattering (GISAXS) analysis of Comparative Examples 1 and 2 and Experimental Example 1, respectively.

Referring to FIG. 4A, with respect to Comparative Example 1, a peak of NPB was not observed.

Referring to FIG. 4B, with respect to Comparative Example 2, as illustrated in dotted lines, broad diffraction peaks of NPB were observed. It may be understood that the deposited layer of Comparative Example 2 had an amorphous structure.

Referring to FIG. 4C, with respect to Experimental Example 1, as illustrated in dotted lines, narrow semicircular-shaped diffraction peaks were observed. Thus, it may be understood that the curved structure 500 of Experimental Example 1 had a polycrystalline structure. It was observed that the NPB diffraction peak of Experimental Example 1 was more distinct than the diffraction peak of Comparative Example 2.

Figure 5A:
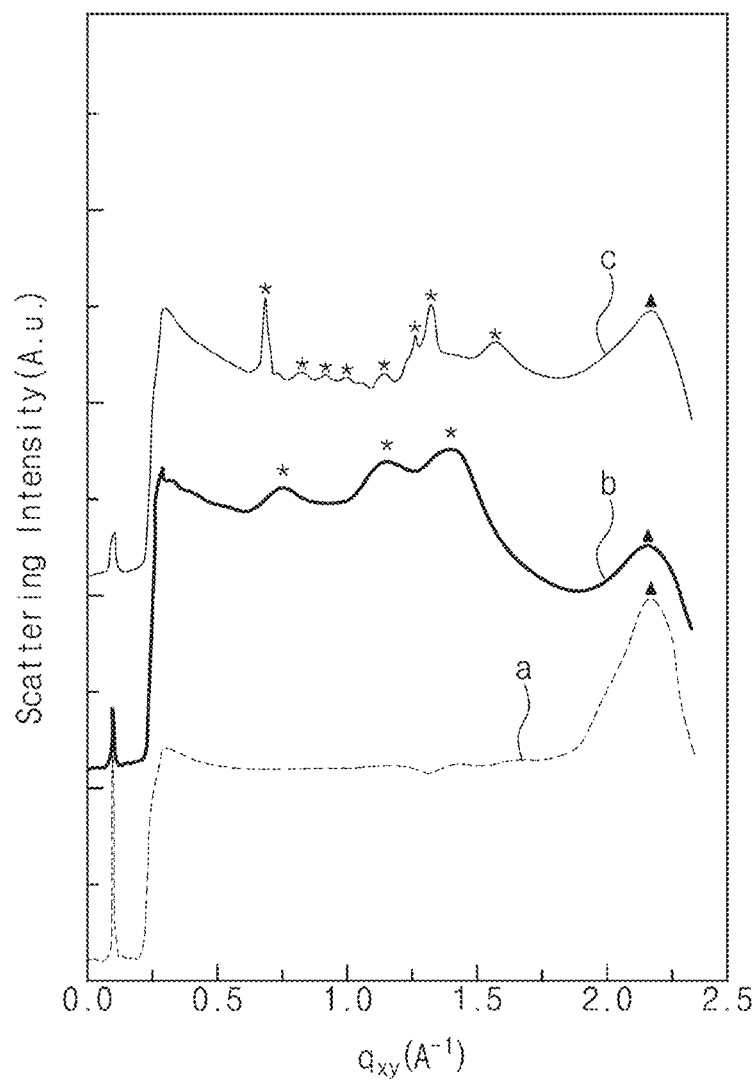
FIG. 5A is a graph illustrating $q_{xy}$-scan curves of Comparative Examples 1 and 2 and Experimental Example 1.
Figure 5B:
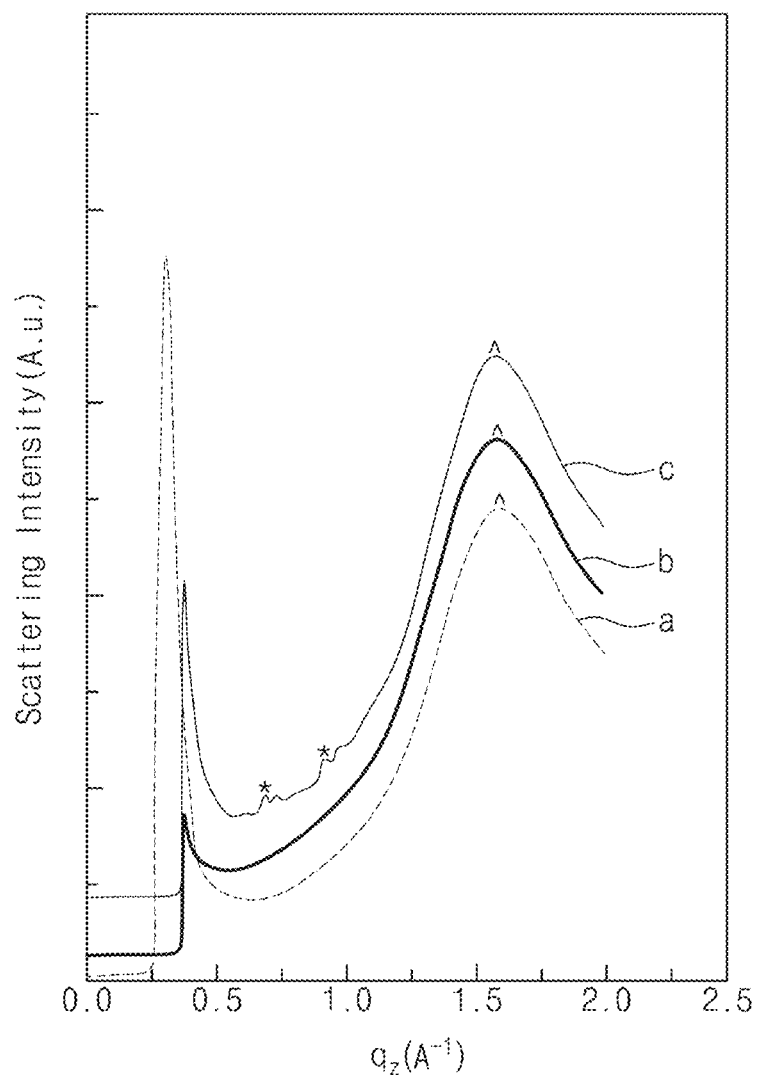
FIG. 5B is a graph illustrating $q_z$-scan curves of Comparative Examples 1 and 2 and Experimental Example 1.

FIG. 5A is a graph illustrating $q_{xy}$-scan curves of Comparative Examples 1 and 2 and Experimental Example 1. FIG. 5B is a graph illustrating $q_z$-scan curves of Comparative Examples 1 and 2 and Experimental Example 1. A portion shown in red color denotes that diffraction intensity is high. $q_{xy}$ may denote a wave vector component in a plane parallel to a diffraction plane, and $q_z$ may denote a wave vector component in a plane perpendicular to the diffraction plane. The y axis represents scattering intensity, and its unit is an arbitrary unit (A.u.). The scan curves labeled a, b, and c are scan curves of Comparative Examples 1 and 2 and Experimental Example 1, respectively.

Referring to FIGS. 5A and 5B together with FIGS. 1C and 4A, the scan curve a was the scan curve of Comparative Example 1, wherein a peak of NPB was not observed in the curve a. A peak of glass (^) and a peak (▲) of indium zinc oxide were observed in the curve a. The scan curve b was the scan curve of Comparative Example 2, wherein broad diffraction peaks (*) of NPB were observed in the curve b. Thus, it may be understood that the deposited layer had an amorphous structure. The scan curve c was the scan curve of Experimental Example 1, wherein diffraction peaks (*) of NPB were observed in the curve c. As the result of analysis of the $q_{xy}$- and $q_z$-scan curves of Experimental Example 1, a monoclinic grain having a β-crystal axis of about 86.62° and a monoclinic grain having a β-crystal axis of about 87.12° were confirmed. Thus, it may be understood that the curved structure 500 included the plurality of grains 510 and any one of the grains 510 had a different crystal structure from another grain 510.

Performance of the optical device may be improved by including the curved structures 500. For example, a moving direction of light transmitted through the curved structures 500 may be controlled by controlling sizes or radii of curvature of the curved structures 500. As another example, a wavelength of the transmitted light may be adjusted by controlling the sizes or radii of curvature of the curved structures 500. According to an embodiment, the optical device may include an organic light-emitting device, and the curved structures 500 may be disposed on a top electrode of the organic light-emitting device. In this case, luminous efficiency of the organic light-emitting device may be improved. According to another embodiment, the optical device may include a solar cell, and the curved structures 500 may be disposed on a top electrode of the solar cell.

Light may be incident on a light-absorbing layer of the solar cell by passing through the curved structures 500. Light absorption efficiency of the light-absorbing layer may be improved by the curved structures 500. As another example, light passing through the light-absorbing layer of the solar cell may be reabsorbed in the light-absorbing layer of the solar cell by being scattered/reflected by the curved structures 500. As another example, since the curved structures 500 are attached to a window, more light may be introduced into the room. According to anther embodiment, the optical device may include a photodetector. The photodetector may detect an electrical signal. Detection performance of the photodetector may be improved by the curved structures 500. According to anther embodiment, the optical device may include an optical film such as an anti-glare film, a light scattering film, a light refraction film, and a haze film. For example, the curved structures 500 may suppress glare and may control reflection and refraction of light by being used in the anti-glare film. According to anther embodiment, the curved structures 500 may function as the haze film.

Figure 6A:
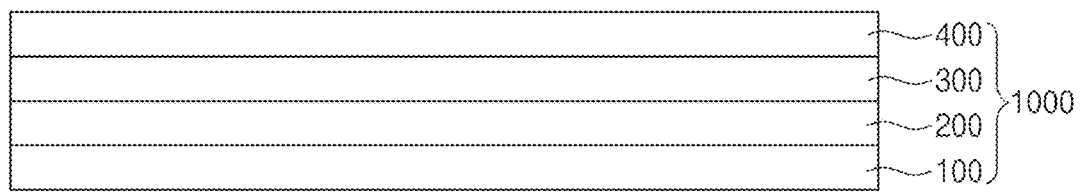
FIGS. 6A and 6B are cross-sectional views illustrating a manufacturing process of an optical device according to another embodiment.
Figure 6B:
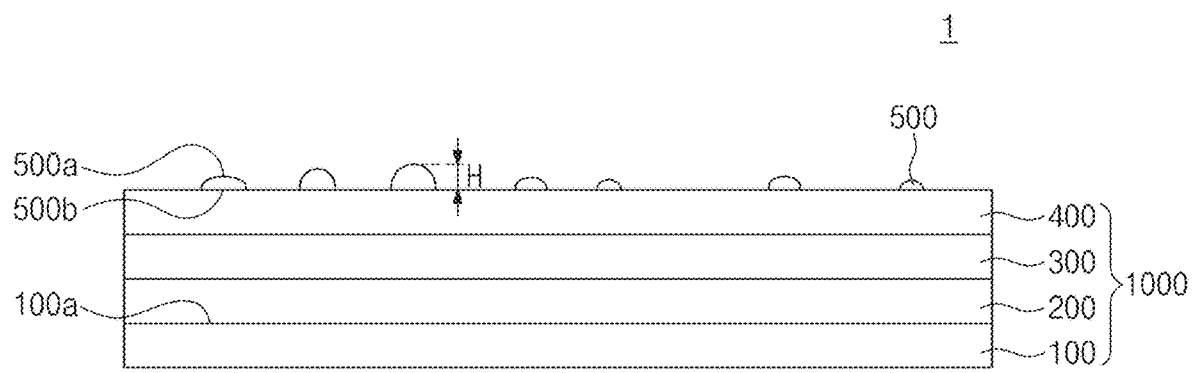

FIGS. 6A and 6B are cross-sectional views illustrating a manufacturing process of an optical device according to another embodiment, which correspond to cross sections taken along line I-II of FIG. 1A.

Referring to FIGS. 1A and 6A, a substrate structure 1000 may be provided. The substrate structure 1000 may include a substrate 100, an electrode layer 200, a lower layer 300, and an upper layer 400. The substrate 100 may be a glass substrate, a plastic substrate, or a polymer substrate. The electrode layer 200 may be provided on the substrate 100. The electrode layer 200 may include a metal or a transparent conductive oxide.

The lower layer 300 may be disposed on the electrode layer 200. For example, the lower layer 300 may function as an organic light-emitting layer, and an optical device 1 may be an organic light-emitting device. As another example, the lower layer 300 may function as a light-absorbing layer, and the optical device 1 may be a solar cell or a photodetector.

The upper layer 400 may be provided on the lower layer 300. The upper layer 400 may have a surface energy of about 0.01 J/m$^2$ to less than about 3 J/m$^2$. The upper layer 400 may include at least one of oxygen, silicon, gallium, germanium, selenium, carbon, and metal. For example, the upper layer 400 may include indium zinc oxide (IZO), indium tin oxide (ITO), indium gallium zinc oxide (IGZO), aluminum oxide, zinc oxide, silicon oxide, or titanium oxide. As another example, the upper layer 400 may include silicon, silicon germanium, silicon nitride, gallium, gallium arsenide, gallium nitride, germanium, or selenium. As another example, the upper layer 400 may include tris-(8-hydroxyquinoline) aluminum (Alq3) and derivatives thereof, N,N'-di(1-naphthyl)-N,N'-diphenyl-(1,1'-biphenyl)-4,4'-diamine (NPB) and derivatives thereof, perylene-3,4,9,10-tetracarboxylic dianhydride (PTCDA) and derivatives thereof, copper phthalocyanine (CuPc) and derivatives thereof, pentacene and derivatives thereof, N,N'-diphenyl-N,N'-bis(3-methylphenyl)-[1,1'-biphenyl)-4,4'-diamine] (TPD) and derivatives thereof, perylene and derivatives thereof, a naphthalene diimide and derivatives thereof, an oligothiophene and derivatives thereof, a perfluorinated oligo-p-phenylene and derivatives thereof, a 2,5-diaryl silole and derivatives thereof, an arylene diamine and derivatives thereof, an aromatic amine and derivatives thereof, a starburst-based organic compound, an amine-based organic compound, a hydrazone-based organic compound, a distyryl-based organic compound, polyimide, polyethersulfone, polysulfone, polyethylene terephthalate, polyethylene naphthalate, graphene, or graphite. As another example, the upper layer 400 may include aluminum, silver, lithium, copper, cesium, iron, gold, titanium, nickel, chromium, molybdenum, platinum, an alloy thereof, or a mixture thereof. One of the upper layer 400 and the electrode layer 200 may act as an anode, and the other one may act as a cathode.

Referring to FIG. 6B, curved structures 500 may be formed on the upper layer 400. In this case, a separate plasma treatment process and a heat treatment process may not be performed on a top surface of the upper layer 400. Accordingly, the lower layer 300 may not be damaged by plasma or heat. The curved structures 500 may be disposed to be laterally spaced apart from each other and may expose the upper layer 400. The curved structures 500 may have bottom surfaces 500b and top surfaces 500a. The bottom surfaces 500b of the curved structures 500 may face the upper layer 400 and may be flat. For example, the bottom surfaces 500b of the curved structures 500 may be parallel to a top surface 100a of the substrate 100. The top surfaces 500a of the curved structures 500 may be opposite to the upper layer 400 and may be curved surfaces. For example, the top surfaces 500a may not have a vertex. The expression "not having a vertex" includes that the vertex is not visually differentiated. According to exemplary embodiments, since the top surfaces 500a of the curved structures 500 are curved surfaces, light emitted from the lower layer 300 may be extracted more to the outside of the upper layer 400. As another example, light incident on the optical device 1 through the curved structures 500 from the outside may be absorbed more in the lower layer 300. As illustrated in FIG. 1A, planar shapes of the curved structures 500 may be spherical or elliptical shapes. A maximum diameter D of each of the curved structures 500 may be in a range of about 0.01 μm to about 2 μm. As illustrated in FIG. 6B, a maximum height H of each of the curved structures 500 may be in a range of about 0.01 μm to about 2 μm. When the maximum diameter D or the maximum height H of each of the curved structures 500 is greater than about 2 μm, a light extraction rate or light absorption rate of the curved structures 500 may be low. The optical device 1 according to an exemplary embodiment may have an improved light extraction rate or light absorption rate. Hereinafter, the formation of the curved structures 500 will be described in more detail with reference to FIG. 2.

Referring again to FIG. 2, the deposition apparatus 50 may include the deposition chamber 10, the source chamber 20, and the carrier chamber 30. The deposition apparatus 50 may be substantially the same as that described above in FIG. 2. Referring to FIGS. 2 and 6B, the substrate 100 may be loaded into the deposition chamber 10 of the deposition apparatus 50. For example, the substrate 100 may be disposed on the chuck 11 in the deposition chamber 10. As described in FIG. 6A, the substrate 100 may be a substrate having a top surface on which the electrode layer 200, the lower layer 300 and the upper layer 400 are formed.

The curved structures 500 may be deposited on the substrate 100. For example, a precursor (see 505 in FIG. 2) may be provided to the source chamber 20. The precursor 505 may include an organic compound. The precursor may further include a material other than the organic compound, but, alternatively, the precursor may not include the material other than the organic compound. The organic compound may include at least one of tris-(8-hydroxyquinoline)aluminum (Alq3) and derivatives thereof, N,N'-di(1-naphthyl)-N, N'-diphenyl-(1,1'-biphenyl)-4,4'-diamine (NPB) and derivatives thereof, perylene-3,4,9,10-tetracarboxylic dianhydride (PTCDA) and derivatives thereof, copper phthalocyanine (CuPc) and derivatives thereof, pentacene and derivatives thereof, N,N'-diphenyl-N,N'-bis(3-methylphenyl)-[(1,1'-biphenyl)-4,4'-diamine] (TPD) and derivatives thereof, perylene and derivatives thereof, a naphthalene diimide and derivatives thereof, an oligothiophene and derivatives thereof, a perfluorinated oligo-p-phenylene and derivatives thereof, a 2,5-diaryl silole and derivatives thereof, an arylene diamine and derivatives thereof, an aromatic amine and derivatives thereof, a starburst-based organic compound, an amine-based organic compound, a hydrazone-based organic compound, and a distyryl-based organic compound. The source chamber 20 may be heated to a temperature of about 200° C. to about 500° C. to form an organic gas from the precursor 505. For example, Alq3 may be used as the precursor 505 and may be provided to the source chamber 20. In this case, the source chamber 20 may be heated to a temperature of about 200° C. to less than about 400° C. by the first temperature controller 22 to form an organic gas. The temperature of the source chamber 20 may be maintained during the formation of the curved structures 500. When the temperature of the source chamber 20 is less than about 200° C., the organic gas may not be formed. When the temperature is about 400° C. or more, an excessive amount of the organic gas may be supplied to the upper layer 400, or the organic material in the source chamber 20 may be modified. In this case, the curved structures 500 may not be formed. As another example, NPB may be used as the precursor 505 and may be provided to the source chamber 20. In this case, the source chamber 20 may be heated to a temperature of greater than about 300° C. to about 500° C. or less by the first temperature controller 22 to form an organic gas. When the temperature of the source chamber 20 is about 300° C. or less, the organic gas may not be formed. When the temperature is greater than about 500° C., an excessive amount of the organic gas may be supplied to the upper layer 400, or the organic material (for example, NPB) in the organic gas may be modified.

The carrier gas may be supplied from the carrier chamber 30 to the source chamber 20. The carrier chamber 30 may be heated to a temperature of about 150° C. to about 250° C. by the second temperature controller 32. In the present disclosure, the expression "temperature of carrier gas is about 150° C. to about 250° C." may include that the carrier gas is supplied from the carrier chamber 30 at a temperature of about 150° C. to about 250° C. The carrier gas may include an inert gas, for example, argon or nitrogen. The organic gas may be transferred from the source chamber 20 to the shower head 15 through the gas passage 25 by the carrier gas. The shower head 15 may be disposed at an upper end of the deposition chamber 10. The shower head 15 may discharge the organic gas and the carrier gas. The organic gas may be deposited on the upper layer 400 to form the curved structures 500. When the temperature of the carrier chamber 30 is less than about 150° C., the organic gas may be condensed by the carrier gas.

During the formation of the curved structures 500, a temperature of the substrate 100 may be adjusted to be in a range of about −30° C. to about 80° C. The temperature of the substrate 100 may be controlled by the third temperature controller 12. The chuck 11 may be disposed on the third temperature controller 12 and may heat or cool the substrate 100. When the temperature of the substrate 100 is less than about −30° C. or greater than about 80° C., malfunction of the manufactured optical device may occur. As another example, the third temperature controller 12 may not be provided.

When the upper layer 400 has a surface energy of less than about 0.01 J/m$^2$ or about 3 J/m$^2$ or more, the curved structures 500 may not be formed. In the present disclosure, the expression "no formation of the curved structures 500" may not only include a case, in which the organic compound is not deposited, but may also include a case in which the deposited organic compound layer is flat without having curved surfaces. According to exemplary embodiments, the upper layer 400 may have a surface energy of about 0.01 J/m$^2$ to less than about 3 J/m$^2$.

According to exemplary embodiments, a separate patterning process for separating the curved structures 500 from each other may be omitted. In addition, separate processes for forming the top surfaces 500a of the curved structures 500 into curved surfaces may be omitted. For example, a separate heat treatment process or a plasma treatment process may not be performed on the curved structures 500. Accordingly, the manufacture of the curved structures 500 may be simplified. In addition, the damage of the lower layer 300 due to the patterning process, heat treatment process, or plasma treatment process may be prevented.

Figure 7A:
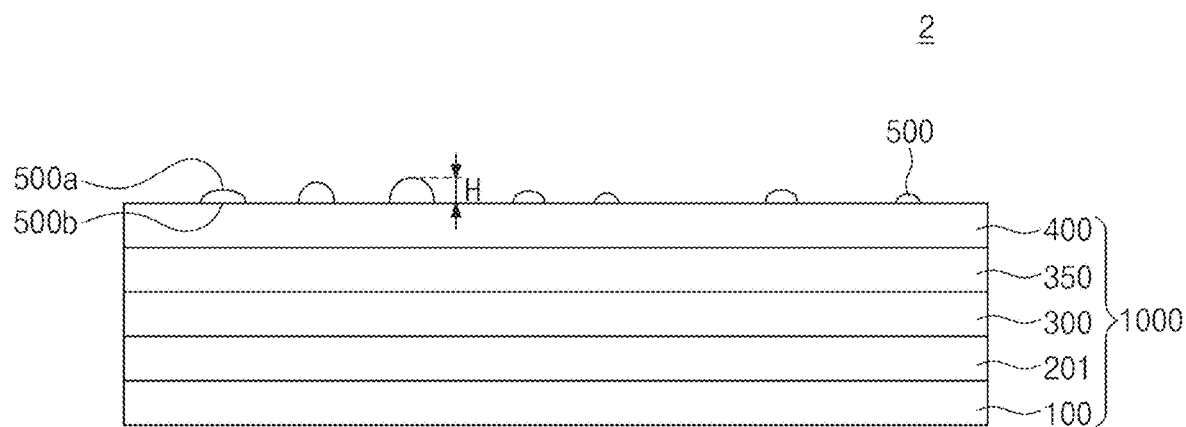
FIG. 7A is a cross-sectional view illustrating an optical device according to another embodiment.

FIG. 7A is a cross-sectional view illustrating an optical device according to another embodiment, which corresponds to a cross section taken along line I-II of FIG. 1A. Hereinafter, descriptions overlapping with those described above will be omitted.

Referring to FIG. 7A together with FIG. 1A, an optical device 2 may include curved structures 500 on a substrate structure 1000. The substrate structure 1000 may include a laminated substrate 100, a first electrode layer 201, a lower layer 300, a second electrode layer 350, and an upper layer 400. The substrate 100, the first electrode layer 201, and the lower layer 300 may include substantially the same materials and may perform substantially the same functions as the substrate 100, the electrode layer 200, and the lower layer 300 which have been described in FIGS. 1A and 6A.

The second electrode layer 350 may be provided on the lower layer 300. The second electrode layer 350 may include a transparent conductive oxide or metal. One of the first electrode layer 201 or the second electrode layer 350 may be an anode and the other one may be a cathode. The upper layer 400 may be provided on the second electrode layer 350. The upper layer 400 may function as a light refraction layer. The upper layer 400 may have a surface energy of about 0.01 J/m$^2$ to less than about 3 J/m$^2$.

For example, the upper layer 400 may control an optical path length of light. In this case, the upper layer 400 may include Alq3 and the derivatives thereof, NPB and the derivatives thereof, indium zinc oxide, indium tin oxide, indium gallium zinc oxide, aluminum oxide, zinc oxide, or a mixture thereof. The curved structures 500 may be formed on the upper layer 400.

Figure 7B:
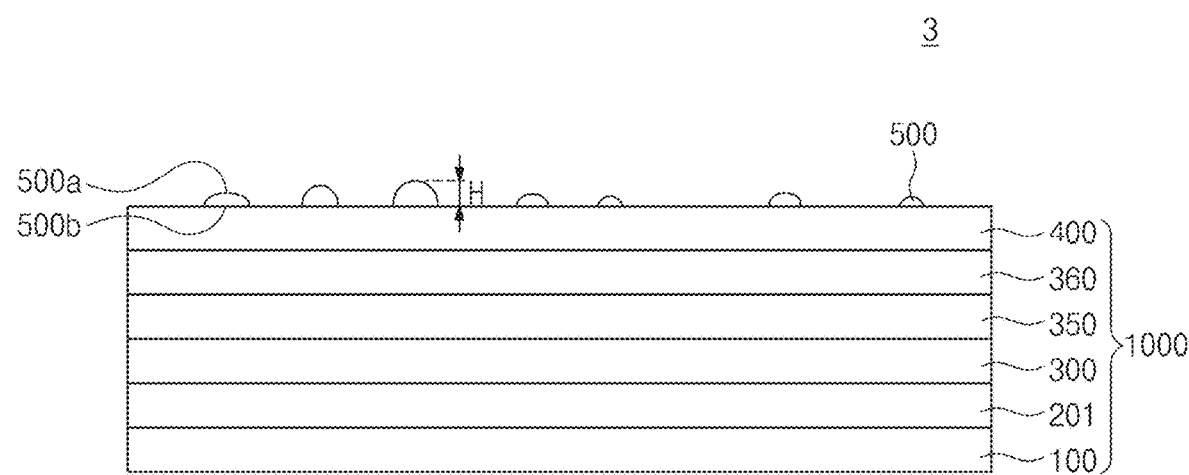
FIG. 7B is a cross-sectional view illustrating an optical device according to another embodiment.

FIG. 7B is a cross-sectional view illustrating an optical device according to another embodiment, which corresponds to a cross section taken along line I-II of FIG. 1A. Hereinafter, descriptions overlapping with those described above will be omitted.

Referring to FIG. 7B together with FIG. 1A, an optical device 3 may include curved structures 500 on a substrate structure 1000. The substrate structure 1000 may include a laminated substrate 100, a first electrode layer 201, a lower layer 300, a second electrode layer 350, a light refraction layer 360, and an upper layer 400. The substrate 100, the first electrode layer 201, and the lower layer 300 may include substantially the same materials and may perform substantially the same functions as the substrate 100, the electrode layer 200, and the lower layer 300 which have been described in FIGS. 1A and 6A.

The second electrode layer 350 may be provided on the lower layer 300. The second electrode layer 350 may include a transparent conductive oxide or metal. One of the first electrode layer 201 or the second electrode layer 350 may be an anode and the other one may be a cathode. The light refraction layer 360 may be disposed on the second electrode layer 350. The light refraction layer 360 may control the optical path length of light. The light refraction layer 360 may include Alq3 and the derivatives thereof, NPB and the derivatives thereof, indium zinc oxide, indium tin oxide, indium gallium zinc oxide, aluminum oxide, zinc oxide, or a mixture thereof. The upper layer 400 may be provided on the light refraction layer 360. The upper layer 400 may function as a passivation layer. The upper layer 400 may have a surface energy of about 0.01 J/m$^2$ to less than about 3 J/m$^2$. For example, the lower layer 300 may not be damaged by external moisture or air due to the upper layer 400. In this case, the upper layer 400 may include at least one of aluminum oxide, silicon oxide, titanium oxide, silicon nitride, silicon carbide, ultraviolet (UV) curable acrylates, hexamethyldisiloxane, an epoxy resin, Alq3 and the derivatives thereof, or NPB and the derivatives thereof. The curved structures 500 may be provided on the upper layer 400.

Figure 8A:
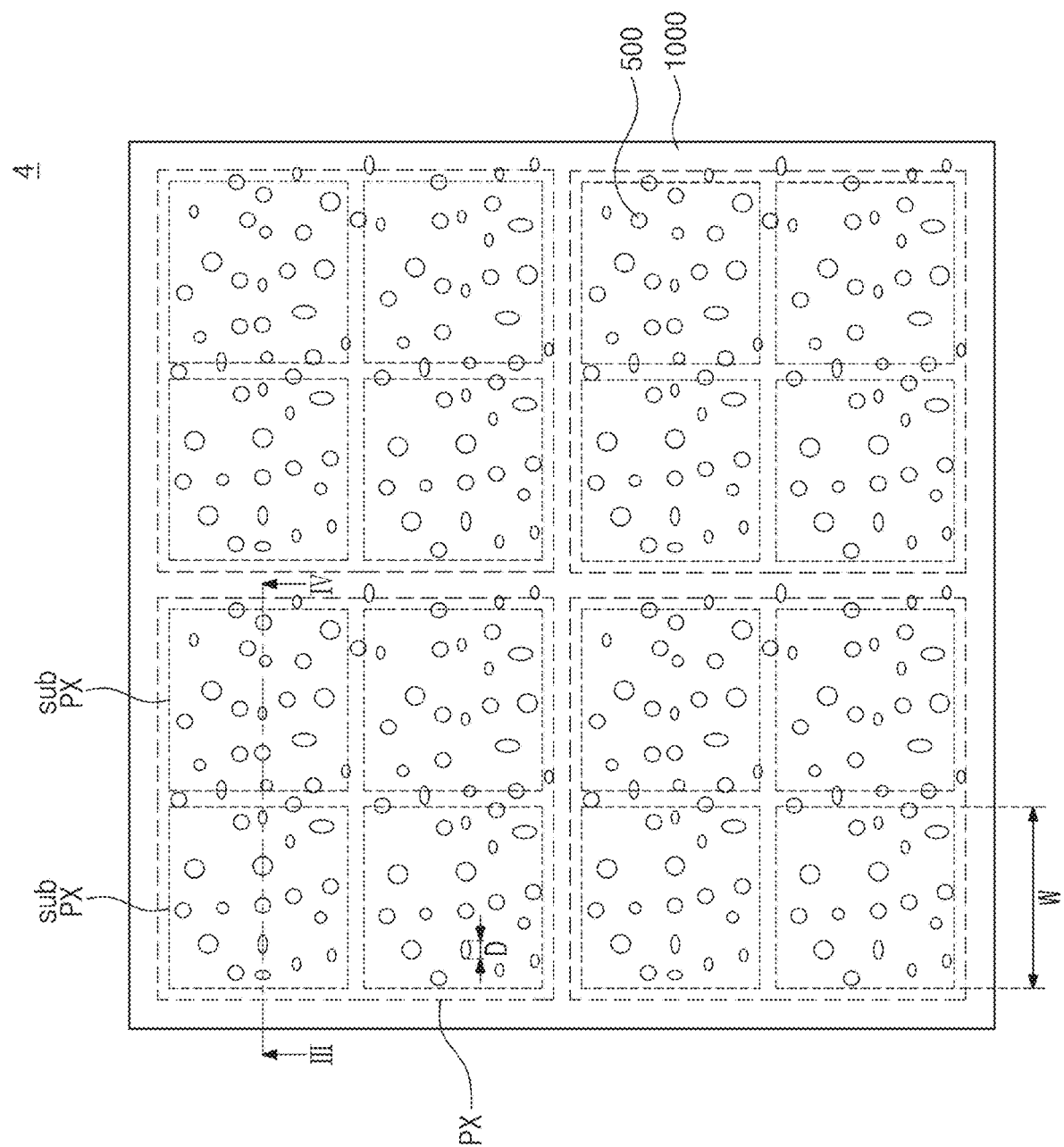
FIG. 8A is a plan view illustrating an optical device according to another embodiment.
Figure 8B:
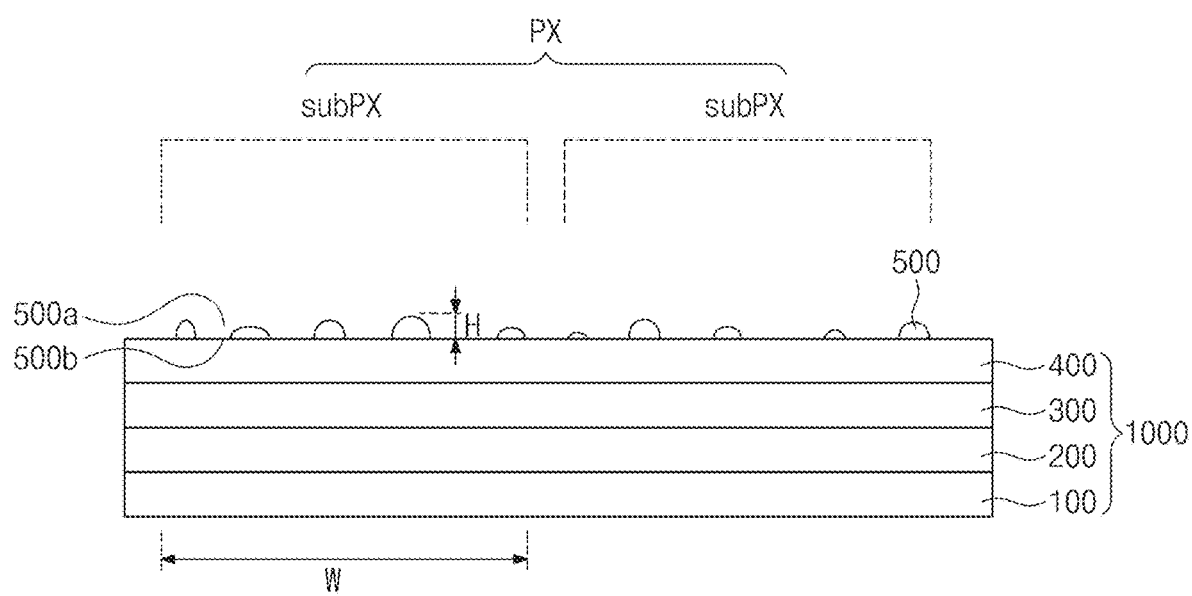
FIG. 8B is a cross-sectional view taken along line III-IV of FIG. 8A.

FIG. 8A is a plan view illustrating an optical device according to another embodiment. FIG. 8B is a cross-sectional view taken along line III-IV of FIG. 8A. Hereinafter, descriptions overlapping with those described above will be omitted.

Referring to FIG. 8A together with FIG. 1A, an optical device 4 may include curved structures 500 on a substrate structure 1000. The substrate structure 1000 may include a laminated substrate 100, an electrode layer 200, a lower layer 300, and an upper layer 400. The optical device 4 may be an organic light-emitting device. The substrate 100 may have pixels PX. The pixels PX may include a plurality of sub-pixels subPX. The sub-pixels subPX may display a red, green, blue, or white color. A planar shape of the sub-pixels subPX may be a square, but the planar shape of the sub-pixels subPX is not limited thereto and may vary. The lower layer 300 may function as an organic light-emitting layer. The electrode layer 200 and the upper layer 400 may be the same as described in FIG. 6A. The upper layer 400 may have a surface energy of about 0.01 J/m$^2$ to less than about 3 J/m$^2$.

The curved structures 500 may be manufactured by substantially the same method as described in FIG. 6B and may have the same shape. The curved structures 500 may be provided in plurality on each of the sub-pixels subPX. For example, each of the sub-pixels subPX may overlap with the plurality of curved structures 500 on a plane. For example, the maximum diameter D of each of the curved structures 500 may be in a range of about 1/5 to about 1/20 of a width W of the corresponding sub-pixel subPX.

Hereinafter, the manufacture of curved structures according to experimental examples of the inventive concept and the evaluation results thereof will be described.

Manufacture/Observation of Curved Structures

1. Tris(8-hydroxyquinoline)aluminum (Alq3)

COMPARATIVE EXAMPLE 1-1

A glass substrate having a length of about 2.5 cm and a width of about 2.5 cm was prepared. An electrode was prepared by depositing an indium zinc oxide layer having a surface energy of about 2 J/m$^2$ to a thickness of about 60 nm using a sputter. In this case, a plasma treatment or heat treatment was not performed on the indium zinc oxide layer. Alq3 was provided to a source chamber, and the source chamber was heated to about 400° C. A nitrogen gas was supplied to a carrier chamber, and the carrier chamber was heated to about 200° C. A nitrogen gas was injected into the source chamber. In this case, a temperature of the substrate was maintained at about 50° C. Curved structures were tilted at about 45 degrees and observed with a scanning electron microscope (SEM) at 20,000 times magnification.

COMPARATIVE EXAMPLE 1-2

An experiment was performed in the same manner as in Comparative Example 1-1, and curved structures were then observed with a scanning electron microscope. However, the source chamber was heated to about 420° C.

COMPARATIVE EXAMPLE 1-3

An experiment was performed in the same manner as in Comparative Example 1-1, and curved structures were then observed with a scanning electron microscope. However, a silicon oxide layer having a surface energy of about 3 J/m$^2$ was used instead of indium zinc oxide, and the source chamber was heated to about 380° C.

EXPERIMENTAL EXAMPLE 1-1

An experiment was performed in the same manner as in Comparative Example 1-1, and curved structures were then observed with a scanning electron microscope. However, the source chamber was heated to about 340° C. During the formation of the curved structures, a temperature of the substrate was maintained at about 0° C.

EXPERIMENTAL EXAMPLE 1-2

An experiment was performed in the same manner as in Experimental Example 1-1, and a surface of the glass substrate was then observed with a scanning electron microscope. However, a temperature of the substrate was maintained at about 20° C. during the formation of curved structures.

EXPERIMENTAL EXAMPLE 1-3

An experiment was performed in the same manner as in Experimental Example 1-1, and a surface of the glass substrate was then observed with a scanning electron microscope. However, a temperature of the substrate was maintained at about 50° C. during the formation of curved structures.

EXPERIMENTAL EXAMPLE 1-4

An experiment was performed in the same manner as in Experimental Example 1-1, and a surface of the glass substrate was then observed with a scanning electron microscope. However, the source chamber was heated to about 380° C. During the formation of curved structures, a temperature of the substrate was maintained at about 50° C.

2. N,N'-di(1-naphthyl)-N,N'-diphenyl-(1,1'-biphenyl)-4,4'-diamine (NPB)

COMPARATIVE EXAMPLE 2-1

A glass substrate having a length of about 2.5 cm and a width of about 2.5 cm was prepared. An electrode was prepared by depositing an indium zinc oxide layer having a surface energy of about 2 J/m² to a thickness of about 60 nm using a sputter. In this case, a plasma treatment or heat treatment was not performed on the indium zinc oxide layer. NPB was provided to a source chamber, and the source chamber was heated to about 135° C. A nitrogen gas was supplied to a carrier chamber, and the carrier chamber was heated to about 200° C. A nitrogen gas was injected into the source chamber. In this case, a temperature of the substrate was maintained at about 0° C. Curved structures were tilted at about 45 degrees and observed with a scanning electron microscope (SEM) at 20,000 times magnification.

COMPARATIVE EXAMPLE 2-2

An experiment was performed in the same manner as in Comparative Example 2-1, and a surface of the glass substrate was then observed with a scanning electron microscope. However, a temperature of the substrate was maintained at about 50° C.

COMPARATIVE EXAMPLE 2-3

An experiment was performed in the same manner as in Comparative Example 2-1, and a surface of the glass substrate was then observed with a scanning electron microscope. However, the source chamber was heated to about 190° C.

COMPARATIVE EXAMPLE 2-4

An experiment was performed in the same manner as in Comparative Example 2-1, and a surface of the glass substrate was then observed with a scanning electron microscope. However, the source chamber was heated to about 190° C., and a temperature of the substrate was maintained at about 50° C.

COMPARATIVE EXAMPLE 2-5

An experiment was performed in the same manner as in Comparative Example 2-1, and a surface of the glass substrate was then observed with a scanning electron microscope. However, the source chamber was heated to about 235° C.

COMPARATIVE EXAMPLE 2-6

An experiment was performed in the same manner as in Comparative Example 2-1, and a surface of the glass substrate was then observed with a scanning electron microscope. However, the source chamber was heated to about 235° C., and a temperature of the substrate was maintained at about 50° C.

COMPARATIVE EXAMPLE 2-7

An experiment was performed in the same manner as in Comparative Example 2-1, and a surface of the glass substrate was then observed with a scanning electron microscope. However, the source chamber was heated to about 300° C., and a temperature of the substrate was maintained at about 50° C.

COMPARATIVE EXAMPLE 2-8

An experiment was performed in the same manner as in Comparative Example 2-1, and a surface of the glass substrate was then observed with a scanning electron microscope. However, a silicon oxide layer having a surface energy of about 3 J/m² was used instead of indium zinc oxide, and the source chamber was heated to about 450° C.

EXPERIMENTAL EXAMPLE 2-1

An experiment was performed in the same manner as in Comparative Example 2-1, and a surface of the glass substrate was then observed with a scanning electron microscope. However, the source chamber was heated to about 400° C.

EXPERIMENTAL EXAMPLE 2-2

An experiment was performed in the same manner as in Comparative Example 2-1, and a surface of the glass substrate was then observed with a scanning electron microscope. However, the source chamber was heated to about 400° C., and a temperature of the substrate was maintained at about 50° C.

EXPERIMENTAL EXAMPLE 2-3

An experiment was performed in the same manner as in Comparative Example 2-1, and a surface of the glass substrate was then observed with a scanning electron microscope. However, the source chamber was heated to about 450° C.

EXPERIMENTAL EXAMPLE 2-4

An experiment was performed in the same manner as in Comparative Example 2-1, and a surface of the glass substrate was then observed with a scanning electron microscope. However, the source chamber was heated to about 450° C., and a temperature of the substrate was maintained at about 50° C.

Figure 9A:
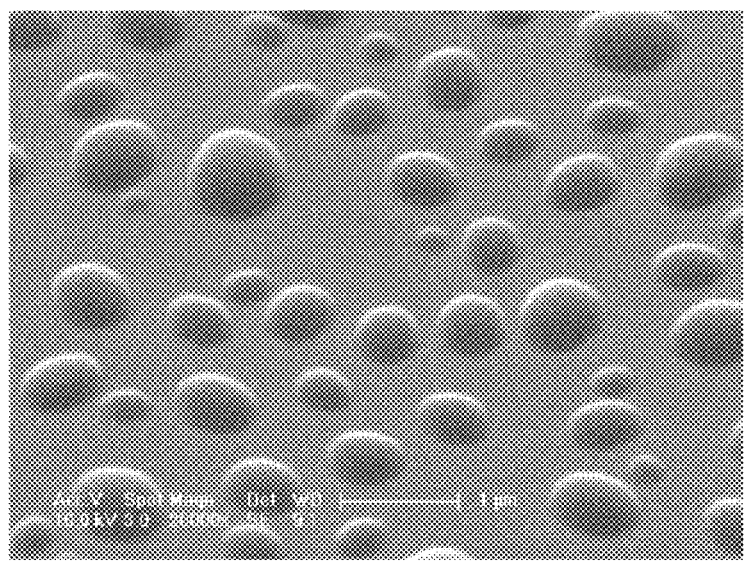
FIGS. 9A and 9B are scanning electron microscope images of plane and cross section of curved structures of Experimental Example 1-4, respectively.
Figure 9B:
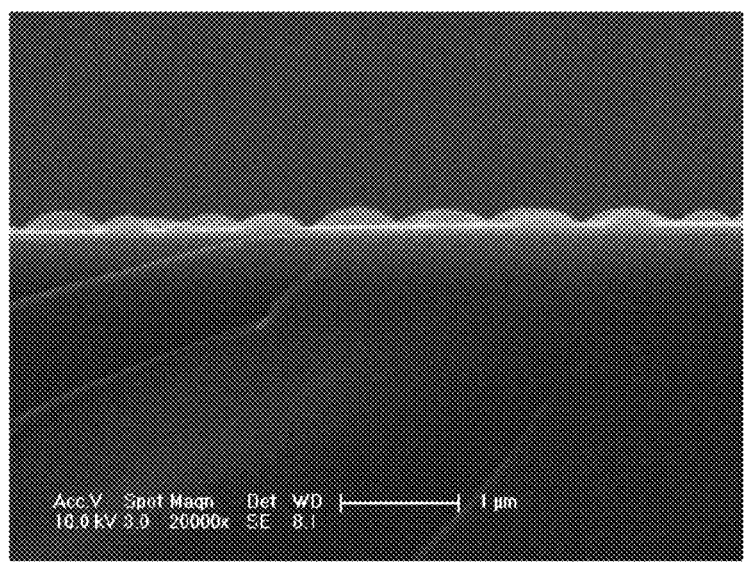
Figure 9C:
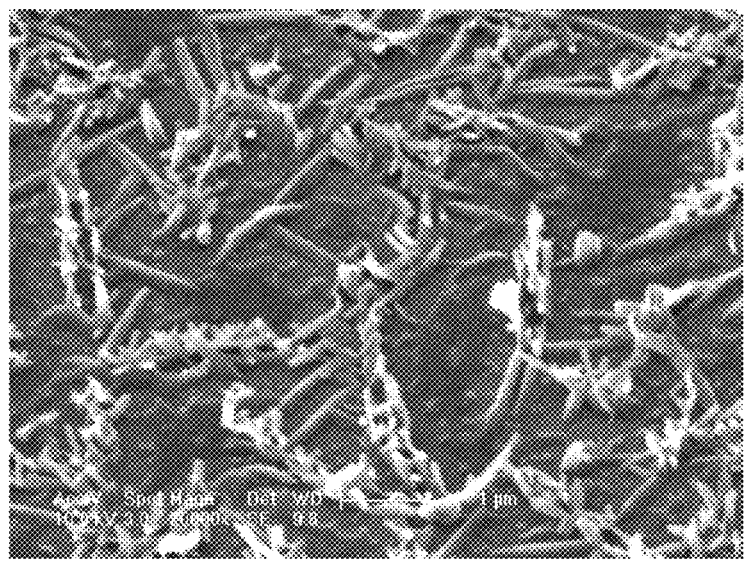
FIGS. 9C and 9D are scanning electron microscope images of surfaces of substrates of Comparative Examples 1-1 and 1-3, respectively.
Figure 9D:
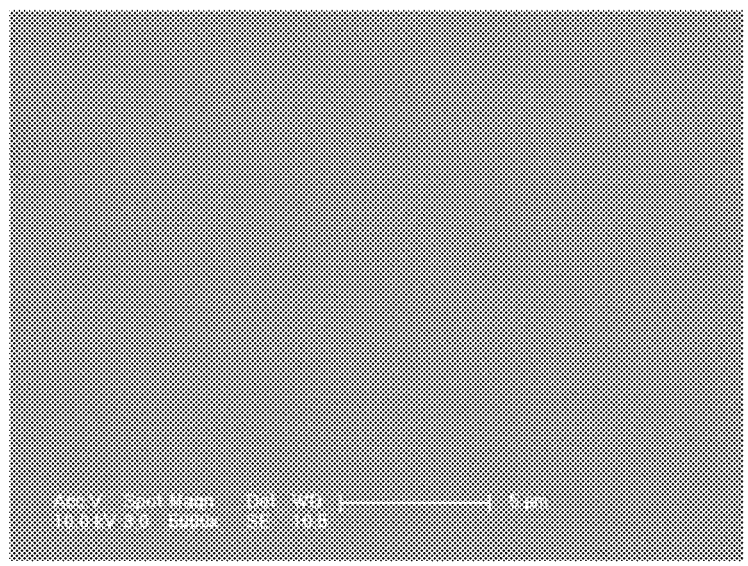

FIGS. 9A and 9B are scanning electron microscope images of plane and cross section of the curved structures of Experimental Example 1-4, respectively. FIGS. 9C and 9D are scanning electron microscope images of surfaces of the substrates of Comparative Examples 1-1 and 1-3, respectively. Table 1 illustrates the results of SEM observations of Comparative Examples 1-1 to 1-3 and Experimental Examples 1-1 to 1-4.

TABLE 1

| | Surface energy of upper layer | Temperature of substrate (° C.) | Temperature of source chamber (° C.) | Formation of curved structures observed with SEM |
|---|---|---|---|---|
| Comparative Example 1-1 | 2 J/m² | 50 | 400 | Not formed |
| Comparative Example 1-2 | 2 J/m² | 50 | 420 | Not formed |
| Comparative Example 1-3 | 3 J/m² | 50 | 380 | Not formed |
| Experimental Example 1-1 | 2 J/m² | 0 | 340 | Formed |
| Experimental Example 1-2 | 2 J/m² | 20 | 340 | Formed |
| Experimental Example 1-3 | 2 J/m² | 50 | 340 | Formed |
| Experimental Example 1-4 | 2 J/m² | 50 | 380 | Formed |

Referring to FIGS. 9A and 9B together with Table 1, it may be observed that the curved structures 500 exposed the upper layer 400 in Experimental Examples 1-1 to 1-4. Each of the curved structures 500 had the maximum diameter D and the maximum height H of less than about 2 μm. From Experimental Examples 1-1 to 1-4, it may be confirmed that, when an organic gas was formed in a temperature range of about 340° C. or more to less than about 400° C., the curved structures 500 were well formed. Referring to FIG. 9C together with Table 1, since the deposited Alq3 layers in Comparative Examples 1-1 and 1-2 entirely covered the upper layer 400, the curved structures 500 were not observed. In Comparative Examples 1-1 and 1-2, since the source chamber 20 was heated to a high temperature (about 400° C. or more), the organic compound was modified or an excessive amount of the organic gas was deposited. Referring to FIG. 9D together with Table 1, the curved structures 500 were not formed in Comparative Example 1-3. Since the upper layer 400 of Comparative Example 1-3 had a surface energy of about 3 J/m², it may be confirmed that the organic gas had high interaction with the upper layer 400.

Figure 10A:
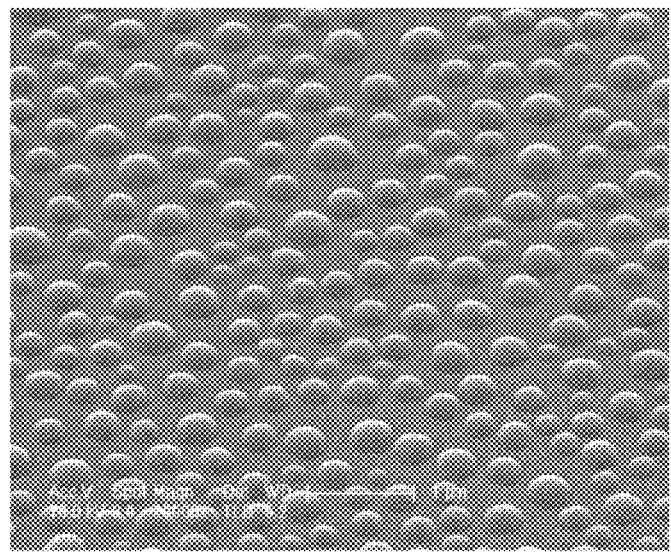
FIGS. 10A and 10B are scanning electron microscope images of plane and cross section of curved structures of Experimental Example 2-3, respectively.
Figure 10B:
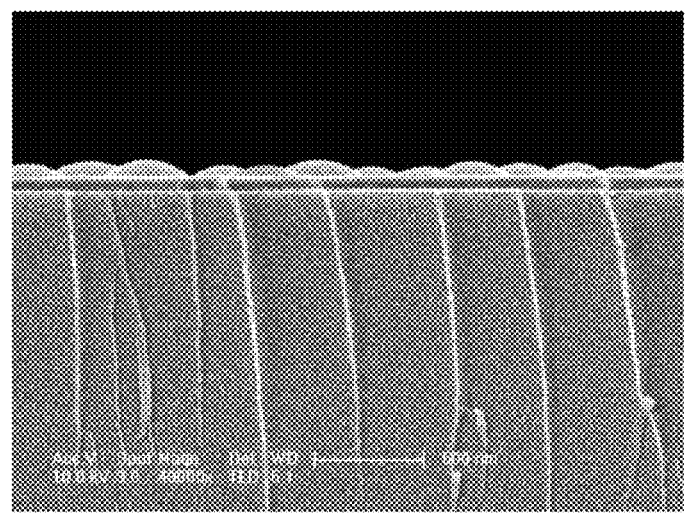
Figure 10C:
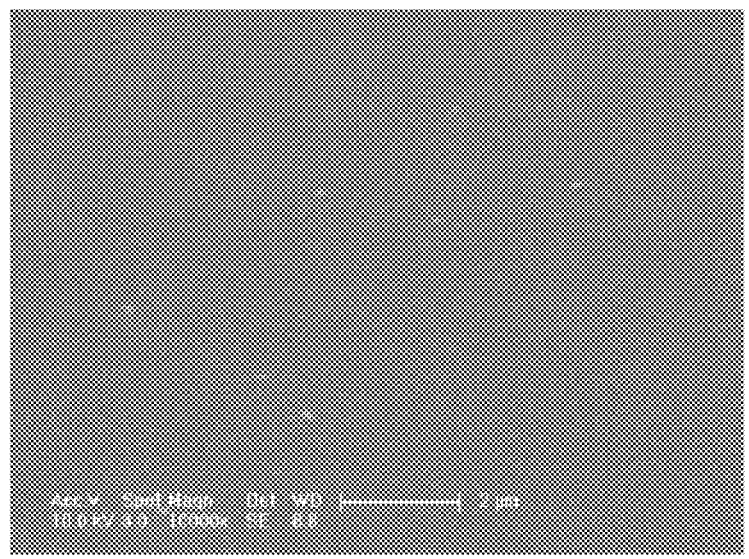
FIGS. 10C and 10D are scanning electron microscope images of surfaces of substrates of Comparative Examples 2-1 and 2-8, respectively.
Figure 10D:
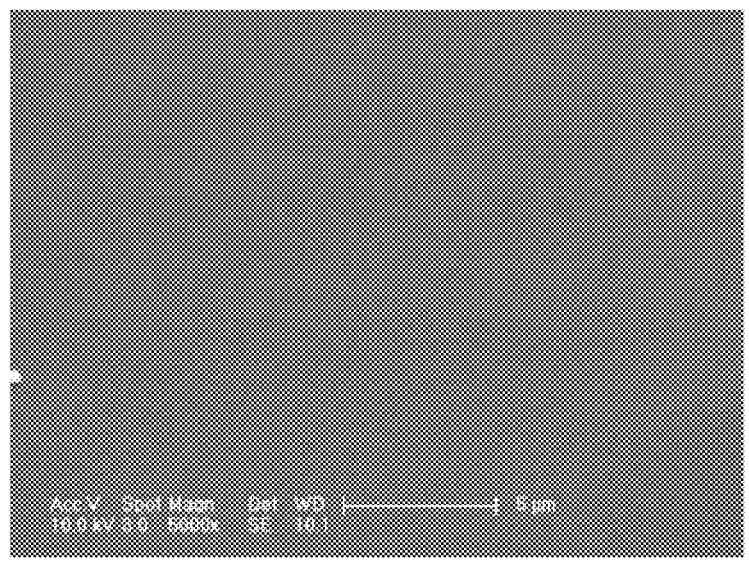

FIGS. 10A and 10B are scanning electron microscope images of plane and cross section of curved structures of Experimental Example 2-3, respectively. FIGS. 10C and 10D are scanning electron microscope images of the surfaces of the substrates of Comparative Examples 2-1 and 2-8, respectively.

The following Table 2 illustrates the results of SEM observations of Comparative Examples 2-1 to 2-8 and Experimental Examples 2-1 to 2-4.

TABLE 2

| | Surface energy of upper layer | Temperature of substrate (° C.) | Temperature of source chamber (° C.) | Formation of curved structures observed with SEM |
|---|---|---|---|---|
| Comparative Example 2-1 | 2 J/m² | 0 | 135 | Not formed |
| Comparative Example 2-2 | 2 J/m² | 50 | 135 | Not formed |
| Comparative Example 2-3 | 2 J/m² | 0 | 190 | Not formed |
| Comparative Example 2-4 | 2 J/m² | 50 | 190 | Not formed |
| Comparative Example 2-5 | 2 J/m² | 0 | 235 | Not formed |
| Comparative Example 2-6 | 2 J/m² | 50 | 235 | Not formed |
| Comparative Example 2-7 | 2 J/m² | 50 | 300 | Not formed |
| Comparative Example 2-8 | 3 J/m² | 0 | 450 | Not formed |
| Experimental Example 2-1 | 2 J/m² | 0 | 400 | Formed |
| Experimental Example 2-2 | 2 J/m² | 50 | 400 | Formed |
| Experimental Example 2-3 | 2 J/m² | 0 | 450 | Formed |
| Experimental Example 2-4 | 2 J/m² | 50 | 450 | Formed |

Referring to FIGS. 10A and 10B together with Table 2, it may be confirmed that the curved structures 500 were formed on the upper layer 400 in Experimental Examples 2-1 to 2-4. It may be observed that the curved structures 500 had an elliptical or spherical shape. In this case, each of the curved structures 500 had the maximum diameter D of about 2 μm or less. Referring to FIG. 10C together with Table 2, it was observed that the curved structures 500 were not formed in Comparative Examples 2-1 to 2-7. From Comparative Examples 2-1 to 2-7, when the temperature of the source chamber 20 was about 300° C. or less, it may be understood that an organic gas was difficult to be formed. In contrast, since the source chamber 20 in Experimental Examples 2-1 to 2-4 was heated to greater than about 300° C., it may be understood that an organic gas was formed. Referring to FIG. 10D together with Table 2, in Comparative Example 2-8, since the upper layer 400 had a surface energy of about 3 J/m², it may be understood that the curved structures 500 were not formed on the upper layer 400.

According to the inventive concept, an array may be provided by deposition of curved structures on a substrate. Accordingly, a separate mask forming process or a photolithography process for the formation of the curved structures may be omitted. Thus, a manufacturing process of the curved structures may be simplified. The curved structures of the inventive concept may disperse, focus, or scatter light. Since an optical device includes the curved structures, performance of the optical device may be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing an optical device, the method comprising:
   forming a substrate structure including a substrate, an anode layer, a cathode layer, and an intermediate layer between the anode layer and the cathode layer, the intermediate layer being one of a light-emitting layer and a light-absorbing layer;
   heating a precursor to form an organic vapor under a pressure condition of from $10^{-4}$ Torr to 1 Torr; and
   depositing the organic vapor on the substrate structure by organic vapor phase deposition or thermal evaporation to form an array of curved structures by crystallization of the organic vapors, the array of curved structures spaced apart from each other, on the substrate structure, each of the curved structures among the array of curved structures having a curved surface facing away from the surface of the substrate structure;
   wherein the curved structures comprise a crystalline organic compound, and
   wherein the intermediate layer either emits a first light to the curved structures based on a first voltage between the anode layer and the cathode layer or receives a second light from the curved structures to generate a second voltage between the anode layer and the cathode layer.

2. The method of claim 1, wherein the precursor comprises an amorphous organic compound.

3. The method of claim 1, wherein the heating of the precursor is performed in a temperature range of from 200° C. to 400° C.

4. The method of claim 1, wherein the substrate structure is provided at a temperature of from −20° C. to 80° C. during the deposition of the array.

5. The method of claim 1, wherein the crystalline organic compound has a pi-conjugation structure.

6. The method of claim 1, wherein each of the curved structures comprises a first grain and a second grain, and
   the second grain has a different crystal structure or a different crystal orientation from the first grain.

7. The method of claim 1, wherein a surface tension of each of the curved structures is higher than surface tension of a top surface of the substrate structure.

8. The method of claim 1, wherein a sum of a surface tension of each respective curved structure and a surface tension at an interface between a top surface of the substrate structure and each respective curved structure is greater than a surface tension of the top surface of the substrate structure.

9. The method of claim 1, wherein the intermediate layer is the light-emitting layer that emits the first light toward the curved structures based on the first voltage applied to the anode layer and the cathode layer.

10. The method of claim 9, wherein the intermediate layer is an organic light-emitting layer.

11. The method of claim 1, wherein the intermediate layer is the light-absorbing layer that generates the second voltage between the anode layer and the cathode layer based on the second light received from the curved structures.

\* \* \* \* \*